(12) United States Patent
Hara et al.

(10) Patent No.: US 8,829,517 B2
(45) Date of Patent: Sep. 9, 2014

(54) SUBSTRATE, METHOD FOR FABRICATING THE SAME, AND DISPLAY DEVICE (75) Inventors: Yoshihito Hara, Osaka (JP); Yukinobu Nakata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/810,944

(22) PCT Filed: Jul. 14, 2011

(86) PCT No.: PCT/JP2011/004038
§ 371 (c)(1),
(2), (4) Date: Mar. 14, 2013

(87) PCT Pub. No.: WO2012/011258
PCT Pub. Date: Jan. 26, 2012

(65) Prior Publication Data
US 2013/0270548 A1 Oct. 17, 2013

(30) Foreign Application Priority Data
Jul. 21, 2010 (JP) ................ 2010-164147

(51) Int. Cl.
H01L 29/10 (2006.01)
H01L 29/786 (2006.01)
H01L 27/12 (2006.01)
G02F 1/1345 (2006.01)
G02F 1/1362 (2006.01)
H01L 27/32 (2006.01)
H01L 29/66 (2006.01)

(52) U.S. Cl.
CPC ........ *H01L 29/78693* (2013.01); *H01L 27/124* (2013.01); *G02F 1/13458* (2013.01); *H01L 27/1225* (2013.01); *G02F 1/136227* (2013.01); *H01L 27/3276* (2013.01); *H01L 29/66969* (2013.01)
USPC ................ 257/43; 438/85; 438/86; 438/104; 257/59; 257/57

(58) Field of Classification Search
CPC ............. H01L 27/1225; H01L 27/124; H01L 27/3276; H01L 29/66969; H01L 29/78693
USPC ............ 257/43, 59, 57; 438/85, 86, 104, 754
See application file for complete search history.

(56) References Cited

U.S. PATENT DOCUMENTS

| 6,414,730 B1 | 7/2002 | Akamatsu et al. |
| 7,019,797 B2 * | 3/2006 | Choi et al. ...................... 257/59 |

(Continued)

FOREIGN PATENT DOCUMENTS

| JP | 2000-199917 A | 7/2000 |
| JP | 2002-176056 A | 6/2002 |

(Continued)

OTHER PUBLICATIONS

Official Communication issued in International Patent Application No. PCT/JP2011/004038, mailed on Aug. 23, 2011.

*Primary Examiner* — Jarrett Stark
*Assistant Examiner* — Mohammad M Hoque
(74) *Attorney, Agent, or Firm* — Keating & Bennett, LLP (57) ABSTRACT A TFT substrate (20*a*) includes: an insulating substrate (10*a*); a plurality of source terminals (15) located on the insulating substrate (10*a*); and a first terminal cover (24) covering part of each of the source terminals (15) and made of an oxide semiconductor. The first terminal cover (24) is removed in a region R between adjacent ones of the source terminals (15).

9 Claims, 9 Drawing Sheets

(56) References Cited

U.S. PATENT DOCUMENTS

| | | | |
|---|---|---|---|
| 7,095,459 B2* | 8/2006 | Yoo et al. | 349/42 |
| 7,294,855 B2* | 11/2007 | Baek et al. | 257/72 |
| 7,576,809 B2* | 8/2009 | Choi et al. | 349/43 |
| 2007/0034879 A1* | 2/2007 | Park et al. | 257/72 |
| 2009/0278128 A1* | 11/2009 | Seong et al. | 257/59 |
| 2010/0038642 A1* | 2/2010 | Choi et al. | 257/59 |
| 2010/0127253 A1* | 5/2010 | Inoue et al. | 257/43 |
| 2010/0127266 A1* | 5/2010 | Saito et al. | 257/59 |
| 2010/0285632 A1* | 11/2010 | Inoue et al. | 438/104 |
| 2011/0017995 A1* | 1/2011 | Yamazaki et al. | 257/59 |
| 2011/0018915 A1* | 1/2011 | Umezaki et al. | 345/698 |
| 2011/0169005 A1* | 7/2011 | Saito et al. | 257/59 |
| 2012/0019750 A1* | 1/2012 | Mitsumoto et al. | 349/113 |
| 2012/0049193 A1* | 3/2012 | Saito et al. | 257/59 |
| 2012/0211745 A1 | 8/2012 | Ueda et al. | |

FOREIGN PATENT DOCUMENTS

| | | | |
|---|---|---|---|
| JP | 2007-157916 A | * | 6/2007 |
| JP | 2009065537 | * | 9/2009 |
| WO | 2007/040194 A1 | | 4/2007 |
| WO | 2011/027467 A1 | | 3/2011 |

* cited by examiner

SUBSTRATE, METHOD FOR FABRICATING THE SAME, AND DISPLAY DEVICE

TECHNICAL FIELD

The present disclosure generally relates to substrates, and more particularly to a substrate including a semiconductor layer of an oxide semiconductor, a method for fabricating the substrate, and a display device.

BACKGROUND ART

Liquid crystal display devices having the advantages of small thickness, lightweight, drivability at low voltages, and low power consumption have been recently used as display panels of various types of mobile terminal devices, e.g., cell phones and portable game devices, and electronic equipment, e.g., laptop computers.

In general, a liquid crystal display device includes a pair of opposing substrates (i.e., a thin-film transistor substrate and a counter substrate), a liquid crystal layer provided between the substrates, and a sealing material bonding the substrates together and having a frame shape to enclose liquid crystal between the substrates.

The liquid crystal display device has a display region including a plurality of pixels and used for displaying an image on a portion surrounded by the sealing material, and also has a terminal region (a drive circuit region) defined around the display region.

In the thin-film transistor substrate, a thin-film transistor (hereinafter referred to as a "TFT"), for example, is provided as a switching device in each of the pixels, which are minimum units of an image.

A general bottom-gate TFT includes, for example, a gate electrode provided on an insulating substrate, a gate insulating film covering the gate electrode, an island-shape semiconductor layer of amorphous silicon located on the gate insulating film and overlapping the gate electrode, and a source electrode and a drain electrode opposing to each other on the semiconductor layer.

The TFT substrate includes an insulating substrate and also includes, in the display region, a plurality of scanning lines extending in parallel with each other on the insulating substrate and a plurality of parallel signal lines orthogonal to the scanning lines. The above-mentioned TFT is provided at each of intersections of the scanning lines and the signal lines, i.e., for each pixel.

The signal lines extend to the terminal region, and are connected to source terminals in the terminal region. Likewise, the scanning lines extend to the terminal region, and are connected to gate terminals in the terminal region.

The source terminals and the gate terminals are made of amorphous silicon forming the above-described semiconductor layer. In the terminal region, integrated circuit (IC) chips connected to the source terminals and the gate terminals and a drive circuit board (a flexible printed wiring board) connected to the IC chips and used for supplying an external signal are provided.

In such a TFT substrate, gate electrodes and scanning lines are first formed on an insulating substrate, and then a gate insulating film is formed by, for example, CVD over the entire surface of the insulating substrate. Thereafter, a semiconductor film of amorphous silicon is formed on the gate insulating film by, for example, spattering, and is subjected to processes including photolithography and wet etching, thereby forming a semiconductor layer. In these processes, source and gate terminals of an amorphous silicon film are also formed.

Subsequently, source electrodes and drain electrodes are formed by, for example, dry etching on the semiconductor layer to form TFTs, and then a silicon nitride film, for example, is deposited by plasma CVD over the entire surface of the substrate on which the source electrodes and the drain electrodes are formed, and an interlayer insulating film covering the semiconductor layer, the source electrodes, and the drain electrodes are formed (see, for example, Patent Document 1).

CITATION LIST

Patent Document

[Patent Document 1] Japanese Patent Publication No. 2000-199917

SUMMARY OF THE INVENTION

Technical Problem

In a recent TFT substrate, as a switching device for each pixel, which is a minimum unit of an image, a semiconductor layer of an oxide semiconductor (hereinafter also referred to as an "oxide semiconductor layer") capable of excellent characteristics of high mobility and low off-current has been proposed as a replacement for the above-described semiconductor layer of amorphous silicon.

Recent reduction in size and weight of display devices has demanded that terminals (i.e., source terminals and gate terminals) to which IC chips are connected are arranged at smaller pitches. In view of enhancement of connection reliability, devices with terminal covers for protecting the terminals arranged at small pitches are proposed.

In the case of using an oxide semiconductor as a material for terminal covers, however, when terminal covers of the oxide semiconductor are formed and then plasma etching using a gas ionized and radicalized with plasma is performed by the above-described dry etching, the resistance of the terminal covers decreases due to damage by plasma, resulting in that the terminal cover becomes a conductor. Consequently, a leakage failure occurs between terminals arranged at small pitches, thus causing difficulty in maintaining insulation between the terminals.

It is therefore an object of the present disclosure to provide a substrate capable of preventing occurrence of a leakage failure between terminals even in a configuration in which terminal covers of an oxide semiconductor are provided to cover terminals arranged at small pitches, a method for fabricating the substrate, and a display device.

Solution to the Problem

To achieve the object, a substrate according to the present disclosure includes: a plurality of terminals located on an insulating substrate and made of a metal; and a terminal cover covering part of each of the terminals and made of an oxide semiconductor, wherein the terminal cover is removed in a region between each adjacent ones of the terminals.

In this configuration, in fabrication of a substrate for a display device, even when the terminal cover of the oxide semiconductor becomes a conductor due to a plasma process such as plasma etching, the absence of the terminal cover in the region between the terminals can prevent occurrence of a leakage failure between the terminals even in a configuration in which the terminals are arranged at small pitches. As a result, insulation between the terminals can be maintained.

The substrate may further include: an insulating film located between the terminal cover and the terminals and having a contact hole in which each of the terminals is partially exposed; and another terminal cover made of a conductor and located on surfaces of the terminal cover and the contact hole.

In this configuration, for example, in connecting IC chips to the terminals through an anisotropic conductive film (ACF) or the like, the another terminal cover of the conductor and the anisotropic conductive film can be connected to each other as intended, thereby ensuring electrical connection between the IC chips and the terminals.

In the substrate, the another terminal cover may be removed in the region between the terminals, and an end surface of the terminal cover facing the region between the terminals may be flush with an end surface of the another terminal cover facing the region between the terminals.

In this configuration, since the end surface of the terminal cover facing the region between the terminals is flush with the end surface of the another terminal cover facing the region between the terminals, even when the terminal cover is broken by, for example, overhanging, it is possible to avoid leakage between the terminals caused by broken pieces.

In the substrate, a pitch between each adjacent ones of the terminals may be from 5 μm to 30 μm.

In this configuration, a plurality of terminals can be arranged at small pitches, thus enabling formation of a substrate for a display device applicable to reduction in size and weight of the display device.

In the substrate, the oxide semiconductor may be a metal oxide containing at least a material selected from the group consisting of indium (In), gallium (Ga), aluminium (Al), copper (Cu), nickel (Ni), hafnium (Hf), and zinc (Zn).

In the substrate, the oxide semiconductor may be indium gallium zinc oxide (IGZO).

The substrate may further include a thin-film transistor including an oxide semiconductor layer.

The substrate can prevent occurrence of a leakage failure between the terminals even when the terminals are arranged at small pitches, and insulation between the terminals can be maintained. Accordingly, the substrate can be preferably applied to a display device including: the substrate; another substrate opposing the substrate; and a display medium layer sandwiched between the substrate and the another substrate. The display device can be preferably applied to a display device in which the display medium layer is a liquid crystal layer.

The substrate can be preferably applied to a display device including: the substrate; and a display element located on the substrate. A display device of the present disclosure can be preferably applied to a display device in which a display element is an organic EL display element.

A method for fabricating a substrate according to the present disclosure includes: a terminal formation step of forming a plurality of terminals of a metal on an insulating substrate; an insulating film formation step of forming an insulating film on the insulating substrate so that the insulating film covers the terminals; a terminal cover formation step of forming a terminal cover of an oxide semiconductor on the insulating film; a contact hole formation step of performing dry etching on the insulating film using the terminal cover as a mask, thereby forming a contact hole which reaches each of the terminals through the insulating film; and a terminal cover removal step of forming a conductive film of a conductor on the terminal cover and then etching the conductive film to form another terminal cover on surfaces of the terminal cover and the contact hole, and etching the terminal cover to remove a portion of the terminal cover located in a region between each adjacent ones of the terminals, thereby removing the terminal cover in the region between the terminals.

In this configuration, in fabrication of a substrate for a display device, even when the terminal cover of the oxide semiconductor becomes a conductor due to a plasma process such as plasma etching, the absence of the terminal cover in the region between the terminals can prevent occurrence of a leakage failure between the terminals even when the terminals are arranged at small pitches. As a result, insulation between the terminals can be maintained.

The method may further include a terminal cover protective layer formation step of forming a terminal cover protective layer for protecting the terminal cover on the terminal cover, after the terminal cover formation step.

In this configuration, in fabrication of a substrate for a display device, even in the case of performing a plasma process such as plasma etching, it is possible to effectively reduce damage on the terminal cover by plasma. As a result, leakage in channel portions of the terminal cover can be effectively reduced.

Advantages of the Invention

According to the present disclosure, even in a configuration in which a plurality of terminals are arranged at small pitches and a terminal cover of an oxide semiconductor is provided to cover each of the terminals, it is possible to prevent occurrence of a leakage failure between the terminals, thereby maintaining insulation between the terminals.

DESCRIPTION OF EMBODIMENTS

First Embodiment

Embodiments of the present disclosure will be described hereinafter with reference to the drawings. The present disclosure is not limited to the following embodiments.

Figure 1:
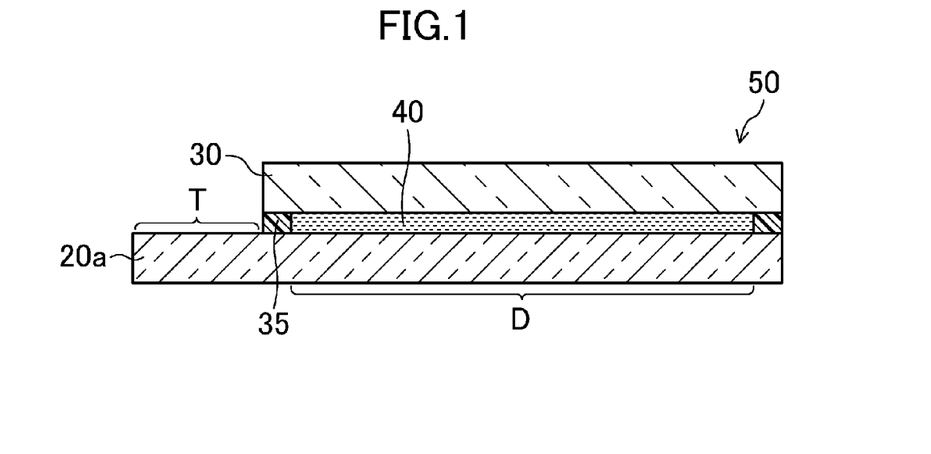
FIG. 1 is a cross-sectional view illustrating a liquid crystal display device including a TFT substrate according to a first embodiment of the present disclosure.
Figure 2:
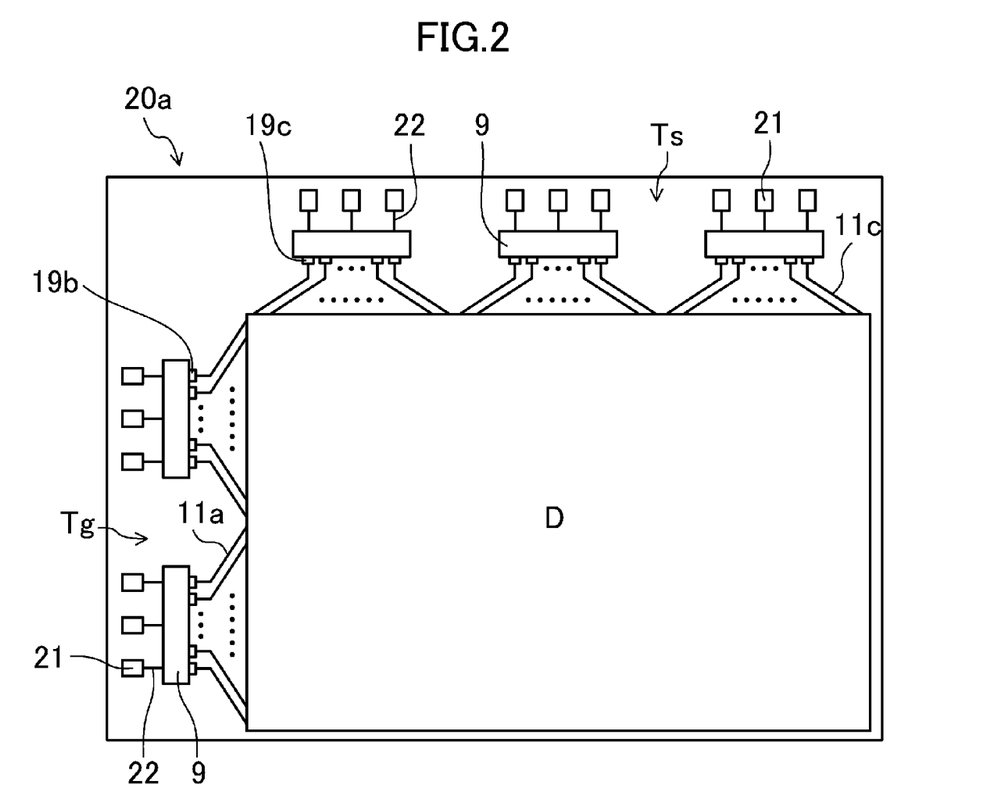
FIG. 2 is a plan view illustrating the TFT substrate of the first embodiment.
Figure 3:
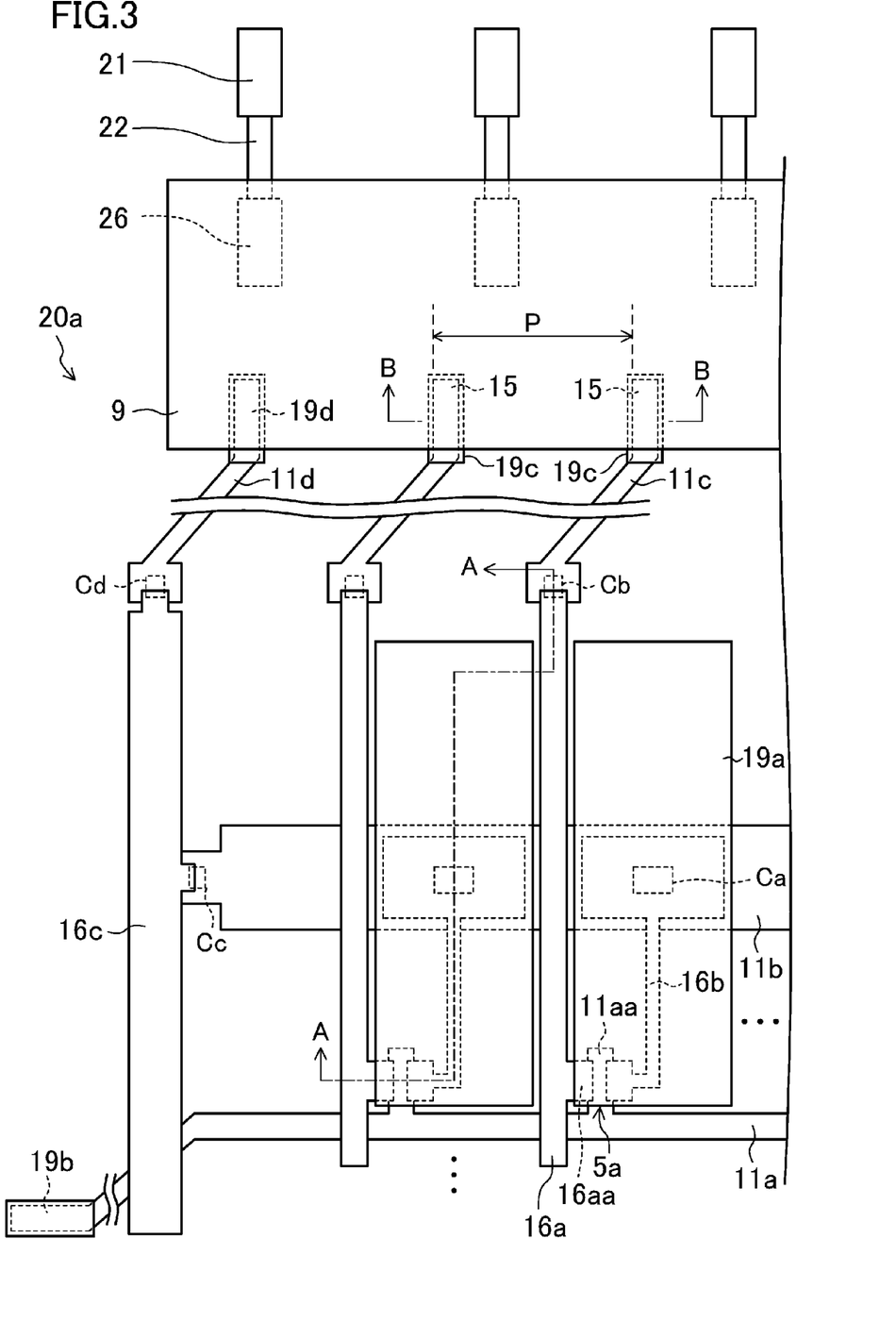
FIG. 3 is an enlarged plan view illustrating a pixel area and a terminal area of the TFT substrate of the first embodiment.
Figure 4:
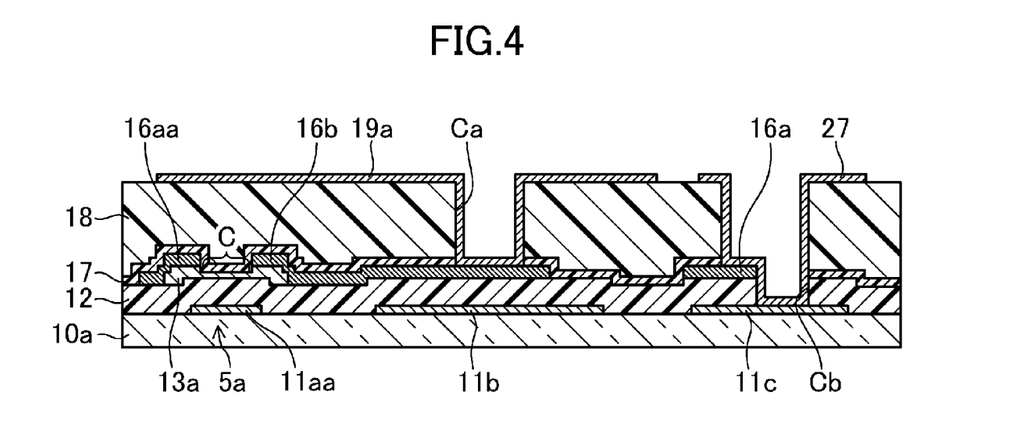
FIG. 4 is a cross-sectional view of the TFT substrate taken along line A-A in FIG. 3.
Figure 5:
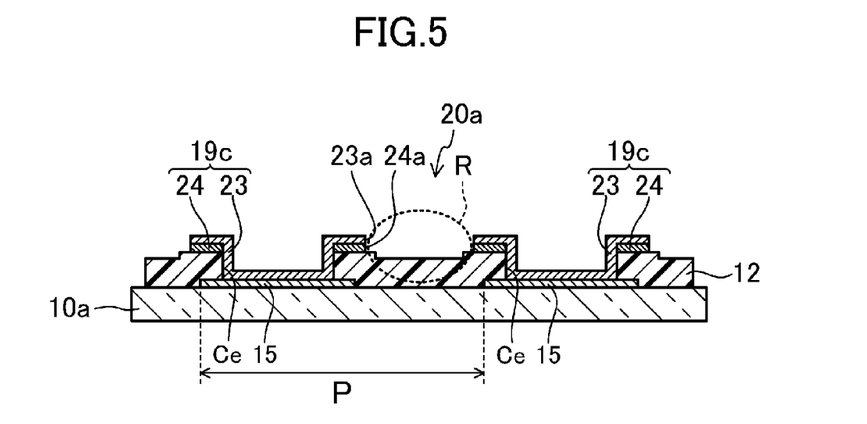
FIG. 5 is a cross-sectional view of the TFT substrate taken along line B-B in FIG. 3.

FIG. 1 is a cross-sectional view illustrating a liquid crystal display device including a TFT substrate according to a first embodiment of the present disclosure. FIG. 2 is a plan view illustrating the TFT substrate of the first embodiment. FIG. 3 is an enlarged plan view illustrating a pixel area and a terminal area of the TFT substrate of the first embodiment. FIG. 4 is a cross-sectional view of the TFT substrate taken along line A-A in FIG. 3. FIG. 5 is a cross-sectional view of the TFT substrate taken along line B-B in FIG. 3. In FIG. 5, IC chips are not shown for convenience of description.

As illustrated in FIG. 1, a liquid crystal display device 50 includes a TFT substrate 20a which is a substrate for a liquid crystal display device and a counter substrate 30 which is another substrate for a liquid crystal display device disposed to face the thin-film transistor 20a. The liquid crystal display device 50 also includes a liquid crystal layer 40 which is a display medium layer and provided between the TFT substrate 20a and the counter substrate 30, and a sealing material 35 sandwiched between the TFT substrate 20a and the counter substrate 30 to bond the TFT substrate 20a and the counter substrate 30 together and having a frame shape for enclosing the liquid crystal layer 40 between the TFT substrate 20a and the counter substrate 30.

As illustrated in FIG. 1, in the liquid crystal display device 50, a display region D for displaying an image is defined inside the sealing material 35, and a terminal region T is defined on a portion of the TFT substrate 20a projecting from the counter substrate 30 when viewed from above. That is, the terminal region T is located around the display region D.

As illustrated in FIGS. 2, 3, and 4, the TFT substrate 20a includes an insulating substrate 10a and also includes, in the display region D, a plurality of scanning lines 11a extending in parallel with each other on the insulating substrate 10a, a plurality of auxiliary capacitor lines 11b extending in parallel with each other and each located between the scanning lines 11a, and signal lines 16a extending in parallel with each other and provided orthogonal to the scanning lines 11a. The TFT substrate 20a also includes a plurality of TFTs 5a provided at respective intersections of the scanning lines 11a and the signal lines 16a, i.e., for respective pixels, an interlayer insulating film 17 covering the TFTs 5a, a planarized film 18 covering the interlayer insulating film 17, pixel electrodes 19 arranged in a matrix on the planarized film 18 and connected to the TFTs 5a, and an alignment film (not shown) covering the pixel electrodes 19a.

As illustrated in FIGS. 2 and 3, the scanning lines 11a extend to a gate terminal region Tg in the terminal region T (see FIG. 1), and constitute gate terminals 19b in this gate terminal region Tg.

As illustrated in FIG. 3, the auxiliary capacitor lines 11b are connected to auxiliary capacitor terminals 19d via auxiliary capacitor main lines 16c and relay lines 11d. The auxiliary capacitor main lines 16c are connected to the auxiliary capacitor lines 11b through contact holes Cc formed in the gate insulating film 12, and also connected to the relay lines 11d through contact holes Cd formed in the gate insulating film 12.

As illustrated in FIGS. 2 and 3, the relay line 11c extend to the source terminal region Ts in the terminal region T (see FIG. 1). The relay lines 11c constitute source terminals 15 in a source terminal region Ts.

As illustrated in FIGS. 3 and 4, the signal lines 16a are connected to the relay lines 11c by a transparent conductive film 27 through contact holes Cb formed in the gate insulating film 12.

As illustrated in FIGS. 2 and 3, IC chips (or driver IC chips) 9 as electric components connected to the source terminals 15 and the gate terminals 19b are provided in the source terminal region Ts and the gate terminal region Tg of the TFT substrate 20a.

The IC chips 9 are mounted by, for example, a chip on glass (COG) technique on the TFT substrate 20a with, for example, an anisotropic conductive film (ACF) interposed therebetween.

As illustrated in FIGS. 2, and 3, in the source terminal region Ts and the gate terminal region Tg of the TFT substrate 20a, connection terminals 21 to which a drive circuit board (not shown) is connected are provided as electric components for supplying external signals. The connection terminals 21 are connected to connection terminals 26 to which the IC chips are connected, with lines 22 interposed therebetween. Signals for driving the IC chips 9 are input from the drive circuit board to the IC chips 9 through the connection terminals 21 and 26 and the lines 22.

Each of the TFTs 5a has a bottom-gate structure and, as illustrated in FIGS. 3 and 4, includes a gate electrode 11aa provided on the insulating substrate 10a, a gate insulating film 12 provided over the gate electrode 11aa, an oxide semiconductor layer 13a located on the gate insulating layer 12 and having an island-shape channel region C overlapping with the gate electrode 11aa, and source and drain electrodes 16aa and 16b provided on the oxide semiconductor layer 13a, overlapping with the gate electrode 11aa, and facing each other with the channel region C sandwiched therebetween.

In this structure, the interlayer insulating film 17 covering the source and drain electrodes 16aa and 16b (i.e., the TFTs 5) is provided on the channel region C of the oxide semiconductor layer 13a.

As illustrated in FIG. 3, the gate electrode 11aa projects from a side of an associated one of the scanning lines 11a. As also illustrated in FIG. 3, the source electrode 16aa projects from a side of an associated one of the signal lines 16a.

As illustrated in FIGS. 3 and 4, the drain electrodes 16b are connected to the pixel electrodes 19a through contact holes Ca formed in the multilayer film of the interlayer insulating film 17 and the planarized film 18. The drain electrodes 16b overlap with the auxiliary capacitor lines 11b with the gate insulating film 12 interposed therebetween, thereby forming auxiliary capacitors.

The oxide semiconductor layer 13a is made of, for example, an oxide semiconductor such as indium gallium zinc oxide (IGZO).

In this embodiment, as illustrated in FIG. 5, protective covers 19c for protecting the source terminals 15 are provided on the source terminals 15 in the source terminal region Ts.

Each of the protective covers 19c includes a first terminal cover 24 formed on the insulating substrate 10a and a second terminal cover 23 formed on the first terminal cover 24.

As illustrated in FIG. 5, the first terminal cover 24 covers part of each of the source terminals 15, and is made of, for example, an oxide semiconductor such as indium gallium zinc oxide (IGZO), in the same manner as the oxide semiconductor layer 13a.

The second terminal covers 23 are made of, for example, a conductor such as indium tin oxide (ITO), indium zinc oxide (IZO), indium tin oxide containing silicon oxide (ITSO), indium oxide containing tungsten oxide, or indium oxide containing titanium oxide.

The source terminals 15 are arranged at small pitches, and as illustrated in FIGS. 3 and 5, a pitch P between each adjacent ones of the source terminals 15 is from 5 µm to 30 µm, for example.

As illustrated in FIG. 5, the gate insulating film 12 is provided between the source terminals 15 and the first terminal covers 24, and has contact holes Ce in which the source terminals 15 are partially exposed.

As also illustrated in FIG. 5, the second terminal covers 23 are provided on the surfaces of the first terminal covers 24 and the contact holes Ce, and the protective covers 19c are connected to the source terminals 15 through the contact holes Ce formed in the gate insulating film 12. Although not shown, the gate terminals 19b have the same structures as those of the source terminals 15 illustrated in FIG. 5.

Figure 8:
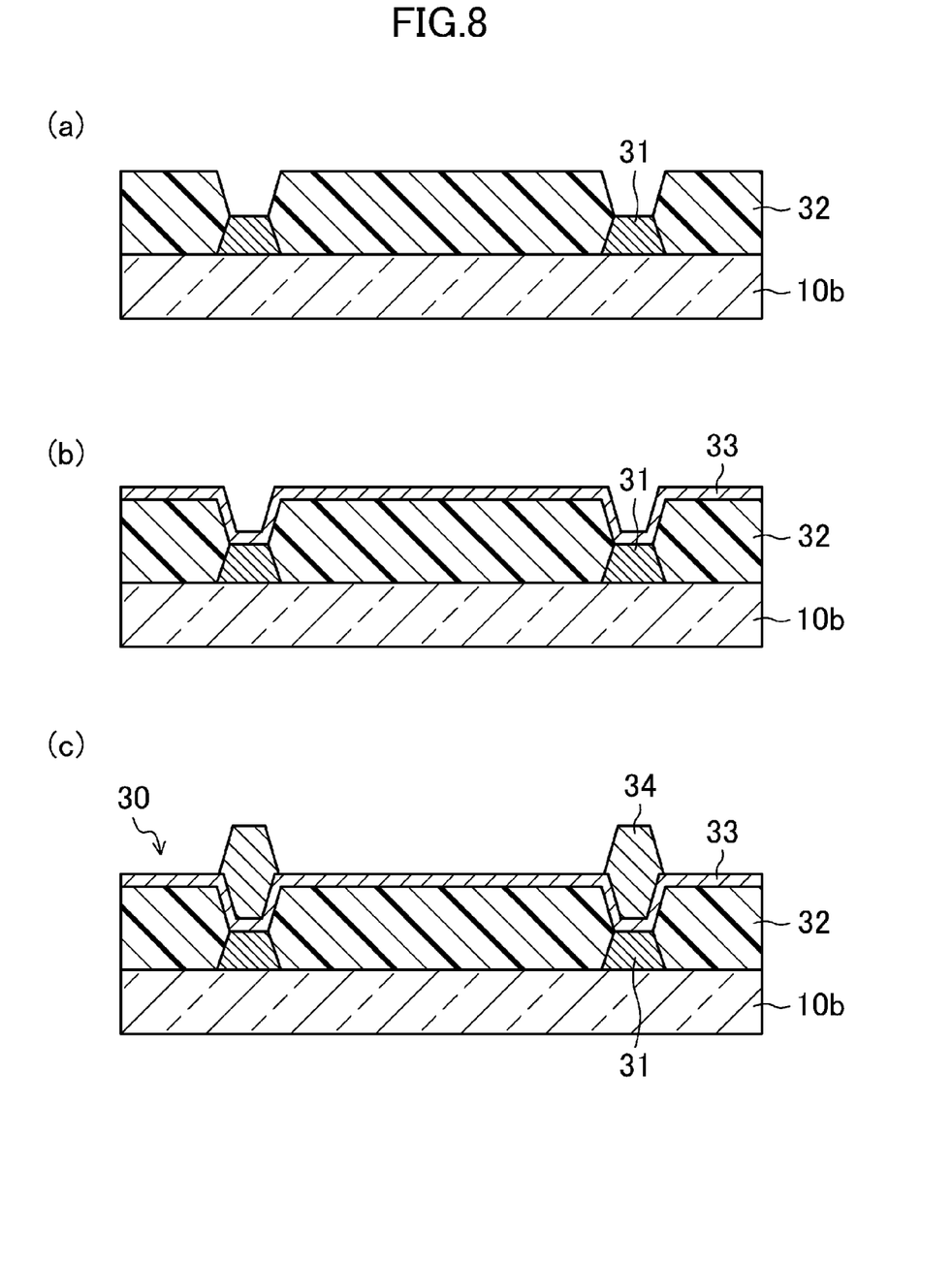
FIG. 8 illustrates cross sections of process steps of forming a counter substrate of the TFT substrate of the first embodiment.

As illustrated in FIG. 8(c), which will be referred to later, the counter substrate 30 includes an insulating substrate 10b and a color filter layer located on the insulating substrate 10b and including a lattice-shaped black matrix 31 and colored films 32, such as a red film, a green film, and a blue film, provided in the respective lattices of the black matrix 31. The counter substrate 30 also includes a common electrode 33 covering the color filter layer, photospacers 34 located on the common electrode 23, and an alignment film (not shown) covering the common electrode 33.

The liquid crystal layer 40 is made of, for example, a nematic liquid crystal material having electrooptic properties.

In each of the pixels in the liquid crystal display device 50 having the above-described configuration, a gate signal is transmitted from the gate driver (i.e., the IC chip 9 connected to the gate terminal 19b) to the gate electrode 11aa through the scanning line 11a. When the TFT 5a is turned on, a source signal is sent from the source driver (i.e., the IC chip 9 connected to the source terminal 15) to the source electrode 16aa through the signal line 16a. In this manner, a predetermined amount of charge is written in the pixel electrode 19a through the oxide semiconductor layer 13a and the drain electrode 16b.

In this process, a potential difference occurs between each of the pixel electrodes 19a of the TFT substrate 20a and the common electrode 33 of the counter substrate 30, resulting in that a predetermined voltage is applied to the liquid crystal layer 40, i.e., the liquid crystal capacitor of each pixel and an auxiliary capacitor connected in parallel to the liquid crystal capacitor.

In each of the pixels in the liquid crystal display device 50, the alignment state of the liquid crystal layer 40 is changed depending on the level of the voltage applied to the liquid crystal layer 40. In this manner, an image is displayed with adjustment of the light transmittance of the liquid crystal layer 40.

As a feature of this embodiment, as illustrated in FIG. 5, the first terminal covers 24 are removed in regions R between adjacent ones of the source terminals 15.

With this configuration, even when the first terminal covers 24 of an oxide semiconductor become conductors due to a plasma process such as plasma etching, the absence of the first terminal covers 24 in the regions R between adjacent ones of the source terminals 15 can prevent occurrence of a leakage failure between the source terminals 15 even when the source terminals 15 are arranged at small pitches. As a result, insulation between the source terminals 15 arranged at small pitches can be maintained.

That is, even in a configuration in which the source terminals 15 are made of an oxide semiconductor such as IGZO instead of amorphous silicon, the source terminals 15 can be arranged at small pitches without the problem of a leakage failure.

Figure 6:
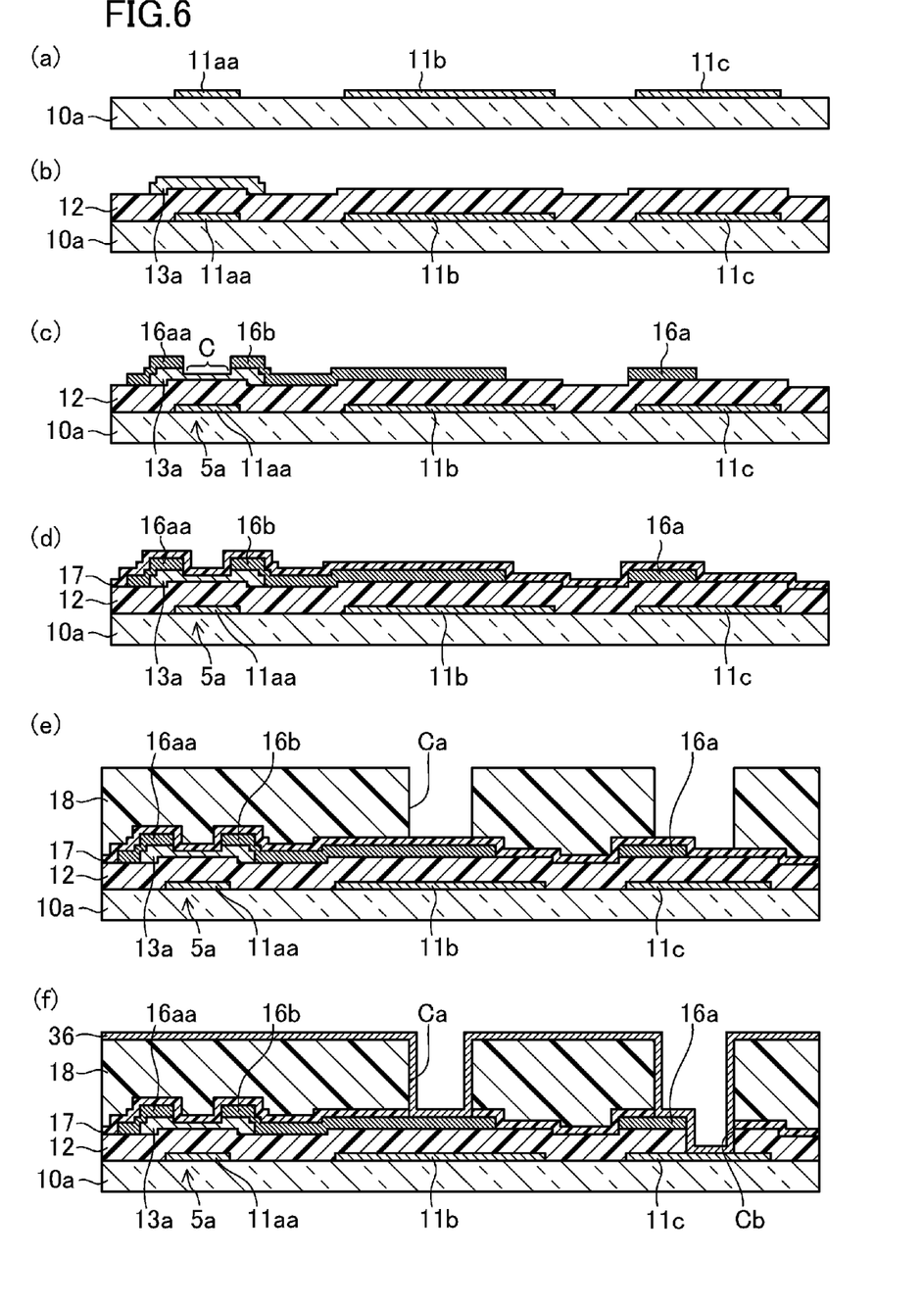
FIG. 6 illustrates cross sections of process steps of forming the TFT substrate of the first embodiment.
Figure 7:
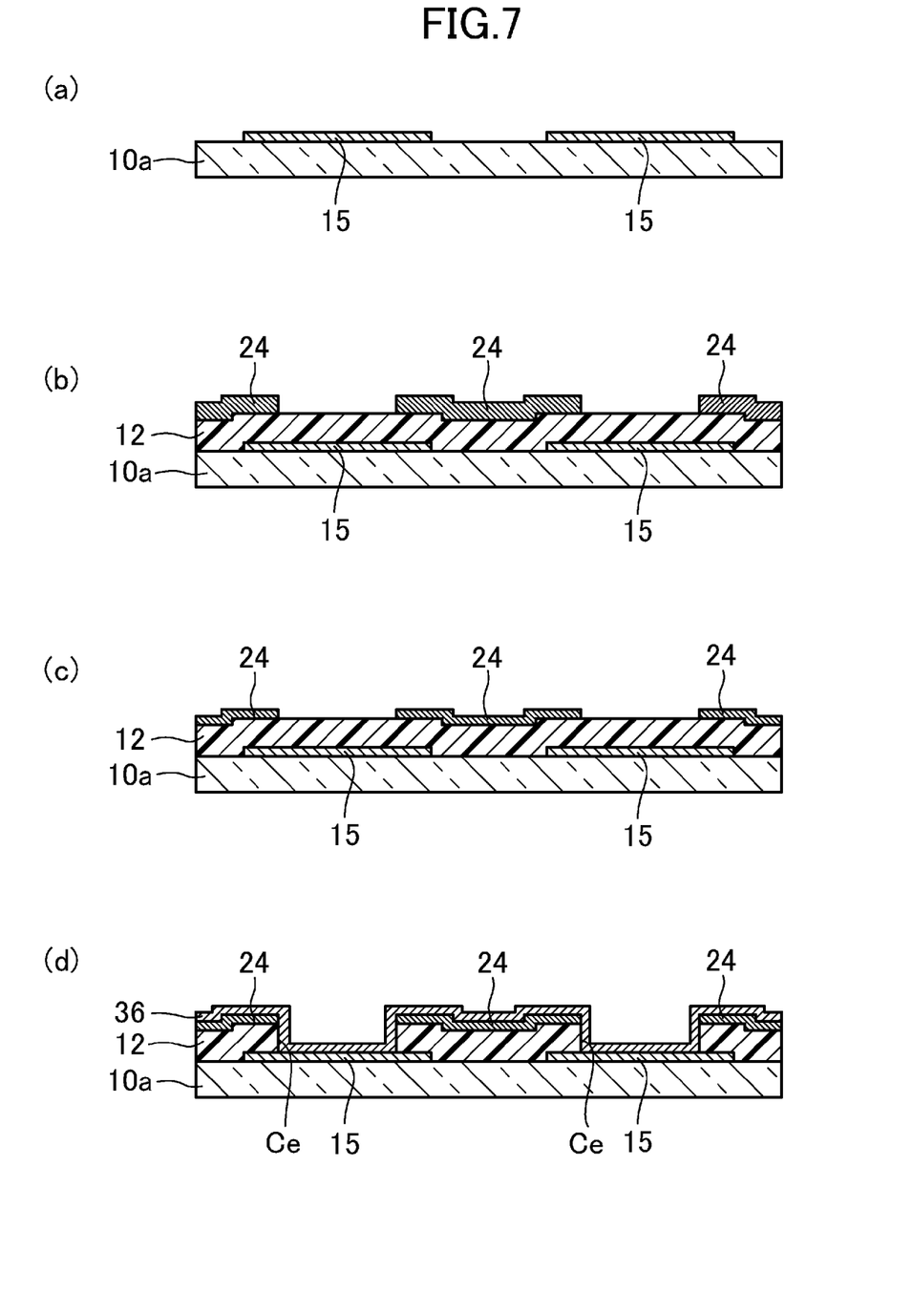
FIG. 7 illustrates cross sections of process steps of forming terminals of the TFT substrate of the first embodiment.

Next, an example method for fabricating the liquid crystal display device 50 according to this embodiment will be described with reference to FIGS. 6-8. FIG. 6 illustrates cross sections of process steps of forming the TFT substrate of the first embodiment. FIG. 7 illustrates cross sections of process steps of forming the terminals of the TFT substrate of the first embodiment. FIG. 8 illustrates cross sections of process steps of forming the counter substrate of the TFT substrate of the first embodiment. The fabrication method of this embodiment includes a TFT substrate formation step, a counter substrate formation step, and a liquid crystal injection step.

A TFT substrate formation step will now be described.

<Source Terminal Formation Step>

First, a molybdenum film (with a thickness of about 150 nm), for example, is deposited by spattering over the entire surface of the insulating substrate 10a of, for example, plastics having thermal resistance, e.g., a glass substrate or a silicon substrate. Then, the molybdenum film is subjected to patterning of a resist by photolithography with a first photomask, wet etching of the molybdenum film, removal of the resist, and irrigation, thereby forming scanning lines 11a, gate electrodes 11aa, gate terminals 19b, auxiliary capacitor lines 11b, relay lines 11c, and source terminals 15 on the insulating substrate 10a, as illustrated in FIGS. 3, 6(a), and 7(a).

In this embodiment, the molybdenum film with a single-layer structure is used as a metal film constituting the source terminals 15, for example. Alternatively, the gate electrodes 11aa, for example, may be formed to have a thickness of 50-300 nm by using, for example, a metal film such as an aluminium film, a tungsten film, a tantalum film, a chromium film, a titanium film, or a copper film, a film of an alloy containing at least one of these elements, or a metal nitride film.

Examples of a material forming the plastic substrate include a polyethylene terephthalate resin, a polyethylene naphthalate resin, a polyethersulfone resin, an acrylic resin, and a polyimide resin.

<Gate Insulating Film Formation Step>

Next, a silicon nitride film (with a thickness of about 100-600 nm), for example, is deposited by CVD over the entire surface of the insulating substrate 10a on which the scanning lines 11a, the gate electrodes 11aa, the auxiliary capacitor lines 11b, the relay lines 11c, and the source terminals 15 are formed, thereby forming a gate insulating film 12 covering the gate electrodes 11aa, the auxiliary capacitor lines 11b, the relay lines 11c, and the source terminals 15, as illustrated in FIGS. 6(b) and 7(b).

The gate insulating film 12 may be made of a stack of two layers. In this case, in addition to the silicon nitride film (SiNx), a silicon oxide film (SiOx), a silicon oxynitride film (SiOxNy, x>y), or a silicon nitride oxide film (SiNxOy, x>y), for example, may be used.

To prevent diffusion of, for example, an impurity from the insulating substrate 10a, a silicon nitride film or a silicon nitride oxide film is preferably used as a lower gate insulating film, whereas a silicon oxide film or a silicon oxynitride film is preferably used as an upper gate insulating film. For example, a silicon nitride film with a thickness of 50-300 nm may be formed as a lower gate insulating film using $SiH_4$ and $NH_3$ as a reactant gas, and a silicon oxide film with a thickness of 50-100 nm may be formed as an upper gate insulating film using $N_2O$ and $SiH_4$ as a reactant gas.

To deposit a dense gate insulating layer 12 with a small gate leakage current at a low temperature, a rare gas such as an argon gas is preferably contained in the reactant gas to be mixed in the insulating film.

<Oxide Semiconductor Layer and First Terminal Cover Formation Step>

Then, an IGZO film (with a thickness of about 30-150 nm), for example, is deposited by spattering. Thereafter, the IGZO film is subjected to patterning of a resist by photolithography with a second photomask, wet etching of the IGZO film, removal of the resist, and irrigation, thereby forming an oxide semiconductor layer 13a and first terminal covers 24 on the gate insulating film 12, as illustrated in FIGS. 6(b), and 7(b).

<Source and Drain Formation Step>

Subsequently, a titanium film (with a thickness of 20-150 nm) and an aluminium film (with a thickness of about 50-400 nm), for example, are stacked in this order by spattering over the entire surface of the substrate on which the oxide semiconductor layer 13a is formed. Thereafter, patterning of a resist by photolithography with a third photomask, patterning of the resist by photolithography, wet etching of the titanium film, dry etching (plasma etching) of the titanium film, removal of the resist, and irrigation are performed, thereby forming source electrodes 16aa, drain electrodes 16b, signal lines 16a (see FIG. 3), and auxiliary capacitor main lines 16c (see FIG. 3) and exposing channel regions C of the oxide semiconductor layer 13a, as illustrated in FIG. 6(c).

That is, in this process, the source electrodes 16aa and the drain electrodes 16b are formed by etching on the oxide semiconductor layer 13a formed in the semiconductor layer formation step, and the channel regions C of the oxide semiconductor layer 13a are exposed.

In this embodiment, overetching performed in forming the source electrodes 16aa and the drain electrodes 16b can reduce the thicknesses of the channel regions C of the oxide semiconductor layer 13a and the first terminal covers 24, as illustrated in FIGS. 6(c) and 7(c).

In this embodiment, the stack of the titanium film and the aluminium film is described as an example metal film constituting the source electrodes 16aa and the drain electrodes 16b. Alternatively, the source electrodes 16aa and the drain electrodes 16b may be made of, for example, a metal film such as a copper film, a tungsten film, a tantalum film, or a chromium film, a film of an alloy containing at least one of these elements, or a metal nitride film.

The conductive material may be a material which is transparent or translucent to light, e.g., indium tin oxide (ITO), indium zinc oxide (IZO), indium tin oxide containing silicon oxide (ITSO), indium oxide ($In_2O_3$), tin oxide ($SnO_2$), zinc oxide (ZnO), and titanium nitride (TiN).

An etching process may be any one of dry etching or wet etching described above. However, in the case of processing a large-area substrate, dry etching is preferably used. Examples of the etching gas include a fluorine-based gas of, e.g., $CF_4$, $NF_3$, $SF_6$, or $CHF_3$, a chlorine-based gas of, e.g., $Cl_2$, $BCl_3$, $SiCl_4$, or $CCl_4$, and an oxygen gas. An inert gas of, for example, helium or argon may be added to the etching gas.

<Interlayer Insulating Film Formation Step>

Thereafter, a silicon oxide film, a silicon nitride film, or a silicon nitride oxide film, for example, is deposited by plasma CVD over the entire surface of the substrate on which the source and drain electrodes 16aa and 16b (i.e., the TFTs 5a) and the signal lines 16a are formed, thereby forming an interlayer insulating film 17 covering the TFTs 5a (i.e., the oxide semiconductor layer 13a and the source and drain electrodes 16aa and 16b) and having a thickness of about 300 nm, as illustrated in FIG. 6(d).

The interlayer insulating film 17 is not limited to the single-layer structure, and may have a two- or three-layer structure.

<Planarized Film Formation Step>

Subsequently, the entire surface of the substrate on which the interlayer insulating film 17 is formed is coated with a photosensitive organic insulating film of, for example, a photosensitive acrylic resin with a thickness of about 2.0-4.0 µm by spin coating or slit coating. Then, this organic insulating film is patterned by photolithography, thereby forming a planarized film 18 formed by patterning on the surface of the interlayer insulating film 17, as illustrated in FIG. 6(e).

<Contact Hole Formation Step>

Subsequently, dry etching (plasma etching) is performed on the gate insulating film 12 and the interlayer insulating film 17 with the planarized film 18 used as a mask (a fourth photomask), thereby forming, through the gate insulating film 12 and the interlayer insulating film 17, contact holes Ca which reach the drain electrodes 16b and contact holes Cb which reach the relay lines 11c and the signal lines 16a, as illustrated in FIGS. 3 and 6(f).

Then, in the source terminal region Ts, dry etching (plasma etching) is performed on the gate insulating film 12 using the first terminal covers 24 as a mask, thereby forming contact holes Ce which reach the source terminals 15 through the gate insulating film 12, as illustrated in FIG. 7(d).

In this process, the first terminal covers 24 of an oxide semiconductor become conductors due to the above-described dry etching (plasma etching).

<Pixel Electrode Formation and Terminal Cover Removal Step>

Thereafter, as illustrated in FIGS. 6(f) and 7(d), a conductive film 36 such as an ITO film (with a thickness of about 50-200 nm) of indium tin oxide, for example, is deposited by spattering over the entire surface of the substrate on which the interlayer insulating film 17 and the planarized film 18 are formed.

Then, the conductive film 36 is subjected to patterning of a resist by photolithography with a fifth photomask, wet etching of the conductive film 36, removal of the resist, and irrigation, thereby forming pixel electrodes 19a, a transparent conductive film 27, connection terminals 21 and 26, connection lines 22, and auxiliary capacitor terminals 19d, as illustrated in FIGS. 3 and 4.

In this process, as illustrated in FIG. 4, the pixel electrodes 19a are formed over the surfaces of the interlayer insulating film 17 and the planarized film 18 to cover the surfaces of the contact holes Ca. The transparent conductive film 27 is formed over the surfaces of the gate insulating film 12, the interlayer insulating film 17 and the planarized film 18 to cover the surfaces of the contact holes Cb, and connect the relay lines 11c to the signal lines 16a.

In the same manner, in the source terminal region Ts, the above-described conductive film 36 is deposited over the first terminal covers 24, and is subjected to patterning of a resist by photolithography with the fifth photomask, wet etching of the conductive film 36, removal of the resist, and irrigation, thereby forming second terminal covers 23 on the first terminal covers 24 as illustrated in FIG. 5 to form protective covers 19c including the first terminal covers 24 formed on the insulating substrate 10a and the second terminal covers 23 formed on the first terminal covers 24.

In this process, as illustrated in FIG. 7(d), the conductive film 36 is also deposited over the surfaces of the contact holes Ce and the source terminals 15, the second terminal covers 23 are formed on the surface of the gate insulating film 12 to cover the surfaces of the contact holes Ce to connect the source terminals 15 to the protective covers 19c.

In the wet etching of the conductive film 36 using a resist as a mask, the first terminal covers 24 are also etched at the same time so that, as illustrated in FIG. 5, part of the first terminal covers 24 located in the regions R between adjacent ones of the source terminals 15 is removed, thus removing the first terminal covers 24 of the oxide semiconductor in the regions R between the source terminals 15.

Accordingly, even when the first terminal covers 24 become conductors due to a plasma process (the plasma etching in this embodiment) after formation of the first terminal covers 24, it is possible to prevent a leakage failure from occurring between the source terminals 15 arranged at small pitches.

In this embodiment, the first terminal covers 24 are etched at the same time as wet etching of the conductive film 36. Thus, as illustrated in FIG. 5, not only the first terminal covers 24 but also the second terminal covers 23 are removed in the regions R between the source terminals 15, and an end surfaces 24a of each of the first terminal covers 24 facing the region R between the source terminals 15 is made flush with an end surface 23a of the associated one of the second terminal covers 23 facing the region R between the source terminals 15. Consequently, even when the first terminal covers 24 are broken by, for example, overhanging, it is possible to avoid occurrence of leakage between the terminals due to broken pieces.

An etchant used for etching of the first terminal covers 24 is not specifically limited as long as removal of the first terminal covers 24 by removing an oxide semiconductor constituting the first terminal covers 24 is ensured.

For example, an etchant capable of etching ITO or IZO, e.g., an etchant containing nitric acid, which is a generally used etchant for amorphous ITO or IZO, may be used.

In the same manner as the second terminal covers 23 described above, the pixel electrodes 19a do not need to be made of indium tin oxide described above, and may be made of indium zinc oxide (IZO), indium tin oxide containing silicon oxide (ITSO), indium oxide containing tungsten oxide, or indium oxide containing titanium oxide, for example.

In the foregoing manner, the TFT substrate 20a illustrated in FIGS. 4 and 5 can be fabricated.

<Counter Substrate Formation Step>

First, the entire surface of the insulating substrate 10b such as a glass substrate is coated with, for example, a black-colored photosensitive resin by spin coating or slit coating, and then is exposed to light and developed, thereby forming a black matrix 31 with a thickness of about 1.0 μm, as illustrated in FIG. 8(a).

Next, the entire surface of the substrate including the black matrix 31 is coated with a red-, green-, or blue-colored photosensitive resin by spin coating or slit coating, and then is exposed to light and developed, thereby forming a colored film 32 of a selected color (e.g., a red film) with a thickness of about 2.0 μm, as illustrated in FIG. 8(a). Similar processes are repeatedly performed for the other two colors, thereby forming colored films 32 of the other two colors (e.g., a green film and a blue film) each with a thickness of about 2.0 μm.

Then, a transparent conductive film such as an ITO film, for example, is deposited by spattering over the substrate including the colored films 32, thereby forming a common electrode 33 with a thickness of about 50-200 nm, as illustrated in FIG. 8(b).

Lastly, the entire surface of the substrate including the common electrode 33 is coated with a photosensitive resin by spin coating or slit coating, and then is exposed to light and developed, thereby forming photospacers 34 each with a thickness of about 4 μm, as illustrated in FIG. 8(c).

In the foregoing manner, a counter substrate 30 is formed.

<Liquid Crystal Injection Step>

First, a resin film of polyimide is applied by printing onto the surfaces of the TFT substrate 20a formed by the above-described TFT substrate formation step and the counter substrate 30 formed by the above-described counter substrate formation step, and is subjected to calcination and rubbing, thereby forming an alignment film.

Next, a sealing material of, for example, an ultraviolet (UV)/thermosetting resin is printed in a frame shape on the surface of the counter substrate 30 on which the alignment film is formed, and then a liquid crystal material is dropped inside the frame of the sealing material.

Thereafter, the counter substrate 30 on which the liquid crystal material has been dropped and the TFT substrate 20a on which the alignment film is formed are bonded together under a reduced pressure to form a bonded assembly. This bonded assembly is then exposed to the air under an atmospheric pressure, thereby pressurizing the front and back surfaces of the bonded assembly.

Subsequently, the sealing material enclosed in the bonded assembly is irradiated with UV light, and then the bonded assembly is heated, thereby curing the sealing material.

Lastly, the bonded assembly enclosing the cured sealing material is diced, for example, and unwanted portions thereof are removed.

In the foregoing manner, the liquid crystal display device 50 of this embodiment is fabricated.

In fabrication of the TFT substrate 20 of this embodiment, the first photomask is used in the gate electrode formation step, the second photomask is used in the oxide semiconductor layer and first terminal cover formation step, the third photomask is used in the source and drain formation step, the fourth photomask is used in the contact hole formation step, and the fifth photomask is used in the pixel electrode formation and terminal cover removal step. That is, five photomasks are used in total. Thus, as compared to a conventional process using five masks, occurrence of a leakage failure between the source terminals 15 arranged at small pitches and made of an oxide semiconductor can be prevented without an increase in the number of photomasks.

The foregoing embodiment can obtain the following advantages.

(1) In this embodiment, the first terminal covers 24 each covering part of each of the source terminals 15 and made of an oxide semiconductor are provided. The first terminal covers 24 are removed in the regions R each between adjacent ones of the source terminals 15. Thus, in the fabrication process of the TFT substrate 20a, even when the first terminal covers 24 of an oxide semiconductor become conductors due to a plasma process such as plasma etching, the absence of the first terminal covers 24 in the regions R between the source terminals 15 can prevent occurrence of a leakage failure between the source terminals 15 even when the source terminals 15 are arranged at small pitches. As a result, insulation between the source terminals 15 can be maintained.

(2) In this embodiment, the pitch P between each adjacent ones of the source terminals 15 is from 5 μm to 30 μm. Thus, the source terminals 15 can be arranged at small pitches, resulting in enabling formation of the TFT substrate 20a applicable to reduction in size and weight of the liquid crystal display device 50.

Second Embodiment

Figure 9:
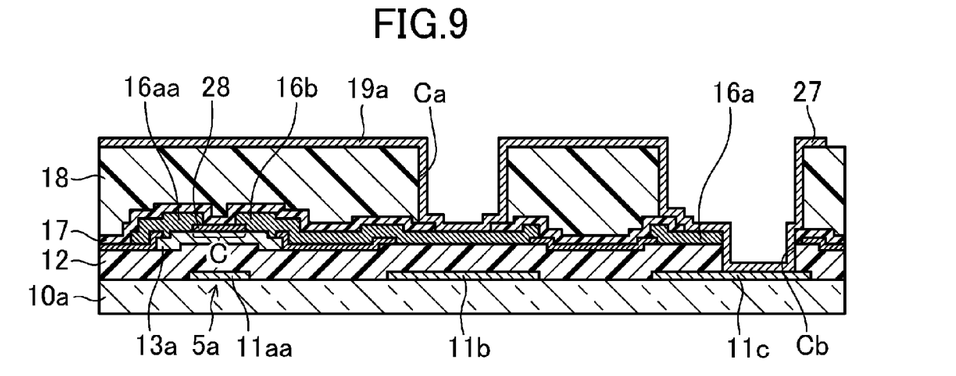
FIG. 9 is a cross-sectional view illustrating a TFT substrate according to a second embodiment of the present disclosure.

A second embodiment of the present disclosure will now be described. FIG. 9 is a cross-sectional view illustrating a TFT substrate according to the second embodiment, and corresponds to FIG. 4. In this embodiment, components identical or equivalent to those described in the first embodiment are designated by the same reference characters, and description thereof will not be repeated. The entire configuration of the liquid crystal display device is substantially the same as that of the first embodiment, and detailed description will not be repeated, either.

As a feature of this embodiment, illustrated in FIG. 11, which will be referred to later, a terminal cover protective layer 29 for protecting first terminal covers 24 is provided on the first terminal covers 24 in fabricating a TFT substrate 20a.

This configuration can effectively reduce damage on the first terminal covers 24 by plasma in formation of source and drain electrodes 16aa and 16b by patterning with dry etching in a source and drain formation step, thereby effectively reducing leakage in channel portions of the first terminal covers 24 serving as a channel layer.

Figure 10:
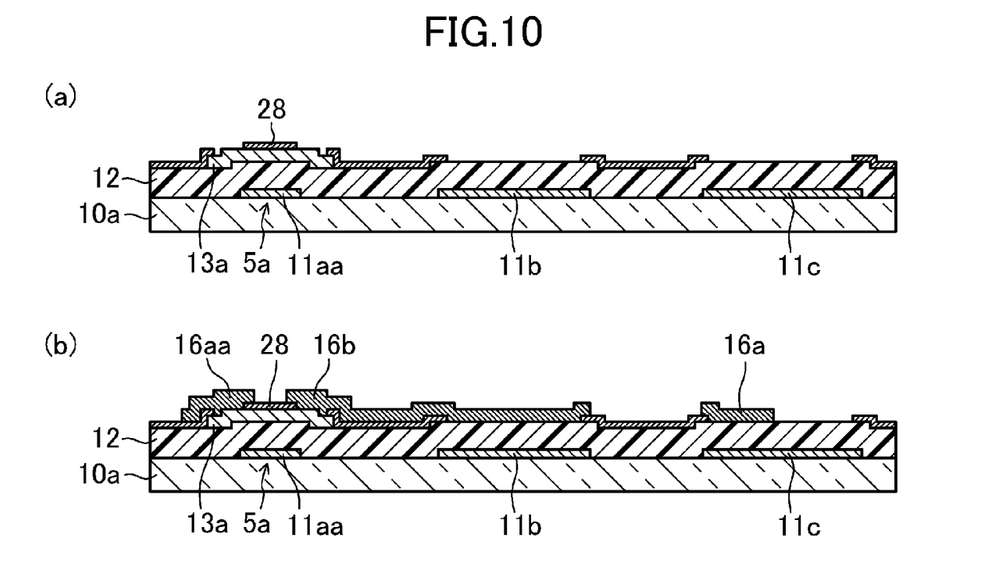
FIG. 10 illustrates cross sections of process steps of forming the TFT substrate of the second embodiment.

Next, an example method for fabricating a liquid crystal display device according to this embodiment will be described with reference to FIGS. 10 and 11. FIG. 10 illustrates cross sections of process steps of forming a TFT substrate according to the second embodiment. FIG. 11 illustrates a cross section of a process step of forming terminals of the TFT substrate of the second embodiment.

First, in a TFT and TFT substrate formation step, in the same manner as in the first embodiment illustrated in FIGS. 6(a), 6(b), 7(a), and 7(b), a source terminal formation step, a gate insulating film formation step, and an oxide semiconductor layer and first terminal cover formation step are performed.

<Terminal Cover Protective Layer Formation Step>

Next, a silicon nitride film, a silicon oxide film, or a silicon nitride oxide film, for example, is deposited by plasma CVD over the entire surface of the substrate on which the oxide semiconductor layer 13a is formed. Then, patterning of a resist by photolithography with a sixth photomask, wet etching of, for example, the silicon nitride film, removal of the resist, and irrigation are performed, thereby forming a channel protective layer (an etching stopper layer) 28 for protecting channel regions C to a thickness of about 50-200 nm on the channel regions C of the oxide semiconductor layer 13a, as illustrated in FIG. 10(a).

Figure 11:
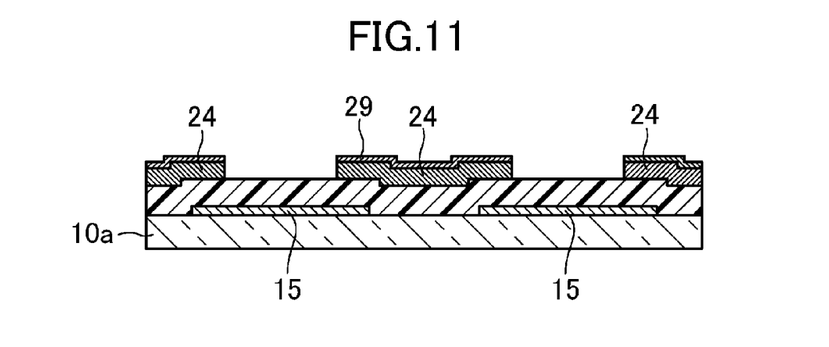
FIG. 11 illustrates a cross section of a process step of forming terminals of the TFT substrate of the second embodiment.

In this process, as illustrated in FIG. 11, in a source terminal region Ts, a silicon nitride film, for example, is also deposited by plasma CVD over the entire surface of the substrate on which first terminal covers 24 are formed. Thereafter, patterning of a resist by photolithography with the sixth photomask, wet etching of, for example, the silicon nitride film, removal of the resist, and irrigation are performed, thereby forming a terminal cover protective layer (an etching stopper layer) 29 for protecting the first terminal covers 24 to a thickness of about 50-200 nm on the first terminal covers 24.

Thereafter, in the same manner as in the source and drain formation step of the first embodiment illustrated in FIGS. 6(c) and 7(c), source electrodes 16aa and drain electrodes 16b are formed, as illustrated in FIG. 10(b).

In this manner, since the terminal cover protective layer 29 for protecting the first terminal covers 24 is provided on the first terminal covers 24 in this embodiment, it is possible to effectively reduce damage on the first terminal covers 24 by plasma in formation of the source and drain electrodes 16aa and 16b by patterning with dry etching in the source and drain formation step. As a result, leakage in channel portions of the first terminal covers 24 can be effectively reduced.

In addition, since the channel protective layer (the etching stopper layer) 28 for protecting the channel regions C is provided on the channel regions C of the oxide semiconductor layer 13a, it is possible to protect the channel regions C of the oxide semiconductor layer 13a so that the channel regions C are not etched during formation of the source and drain electrodes 16aa and 16b by patterning with etching in the source and drain formation step.

Subsequently, after removal of the terminal cover protective layer 29 formed on the first terminal covers 24, in the same manner as in the first embodiment illustrated in FIGS. 6(d)-6(f) and 7(d), an interlayer insulating film formation step, a planarized film formation step, a contact hole formation step, and a pixel electrode formation and terminal cover removal step are performed, thereby forming a TFT substrate 20a illustrated in FIGS. 5 and 9.

Further, a counter substrate formation step and a liquid crystal injection step as described in the first embodiment are performed, thereby fabricating a liquid crystal display device 50 according to this embodiment.

The foregoing second embodiment can obtain not only advantages (1) and (2) described above, but also the following advantages.

(3) In this embodiment, the terminal cover protective layer 29 for protecting the first terminal covers 24 is provided on the first terminal covers 24. Accordingly, it is possible to effectively reduce damage on the first terminal covers 24 by plasma in formation of the source and drain electrodes 16aa and 16b by patterning with dry etching in the source and drain formation step. As a result, leakage in channel portions of the first terminal covers 24 can be effectively reduced.

(4) In this embodiment, the channel protective layer 28 for protecting the channel regions C of the oxide semiconductor layer 13a is provided on the channel regions C. Accordingly, it is possible to protect the channel regions C of the oxide semiconductor layer 13a so that the channel regions C are not etched during formation of the source and drain electrodes 16aa and 16b by patterning with etching in the step of forming the source and drain electrodes 16aa and 16b.

The above embodiments may be modified in the following manner.

In the above embodiments, the first terminal covers 24 are removed in the regions R each between adjacent ones of the source terminals 15. Alternatively, the present disclosure is also applicable to any terminals other than the source terminals 15.

For example, the present disclosure is applicable to a configuration in which the auxiliary capacitor terminals 19d, the gate terminals 19b, and the connection terminals 21 and 26 are arranged at small pitches (5-30 μm) in the same manner as the source terminals 15, terminal covers of an oxide semiconductor are provided to cover part of each of these terminals, and the terminal covers are removed in regions each between adjacent ones of the terminals.

In the above embodiments, an oxide semiconductor layer of an oxide semiconductor such as indium gallium zinc oxide (IGZO) is used as the oxide semiconductor layer 13a. However, the oxide semiconductor layer 13a is not limited to this, and may be made of a metal oxide containing at least one of indium (In), gallium (Ga), aluminium (Al), copper (Cu), nickel (Ni), hafnium (Hf), or zinc (Zn).

Even if the oxide semiconductor layer 13a made of the above-described material is amorphous, high mobility thereof can increase the ON resistance of switching devices. Accordingly, the difference in output voltage in reading data is increased, thereby enhancing the S/N ratio. Instead of IGZO (In—Ga—Zn—O), $InGaO_3(ZnO)_5$, $Mg_xZn_{1-x}O$, $Cd_xZn_{1-x}O$, or CdO, for example, is preferably used. In addition, ISZO (In—Si—Zn—O), IAZO (In—Al—Zn—O), INiZO (In—Ni—Zn—O), ICuZO (In—Cu—Zn—O), IHfZO (In—Hf—Zn—O), or IZO (In—Zn—O), for example, is also preferably used.

The above embodiments are directed to the liquid crystal display devices as examples of a display device. Alternatively, the display device may have an organic electro-luminescence (EL) display, an electrophoretic display, a plasma display (PD), a plasma addressed liquid crystal (PALC) display, an inorganic electro-luminescence (EL) display, a field emission display (FED), or a surface-conduction electron-emitter display (SED), etc.

Figure 12:
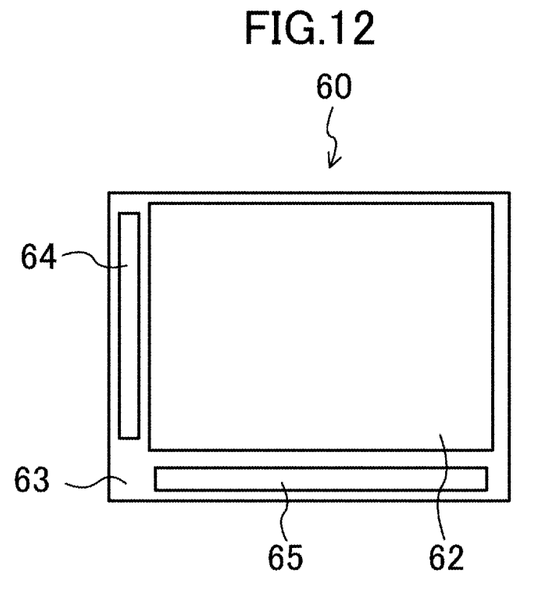
FIG. 12 is a plan view illustrating an organic EL display device according to a variation of the present disclosure.
Figure 13:
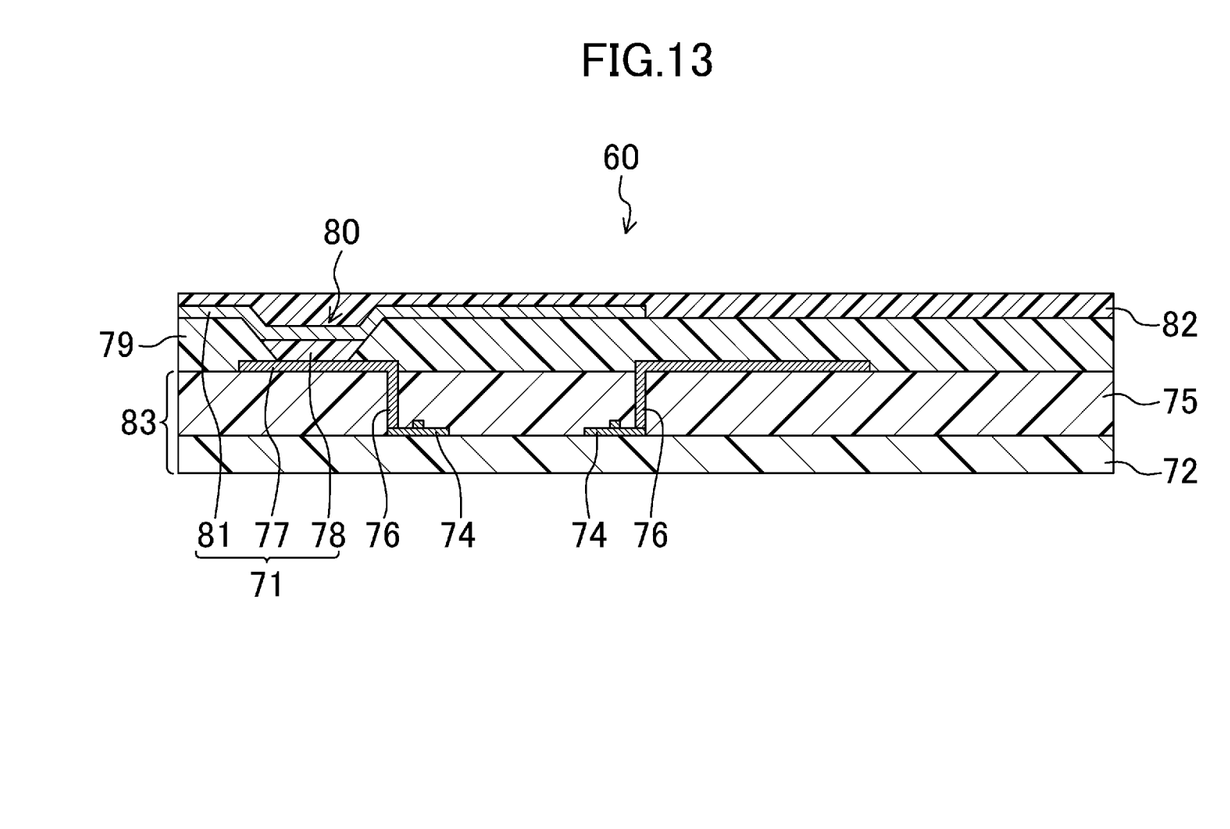
FIG. 13 is a cross-sectional view illustrating the organic EL display device of the variation.

For example, the present disclosure is applicable to an organic EL display device 60 illustrated in FIGS. 12 and 13. The organic EL display device 60 includes a base layer 72 which is a film-like insulating substrate of a colorless transparent resin film evaporated at room temperature. Examples of the colorless transparent resin film constituting the base layer 72 include organic materials such as a polyparaxylene resin and an acrylic resin. The base layer 72 has a thickness of, for example, 3-10 μm.

The organic EL display device 60 also includes a display device substrate 83 including TFTs 74 formed on the base layer 72, an interlayer insulating film 75, such as a $SiO_2$ film or a SiN film, covering the TFTs 74, and a metal interconnect 76 electrically connected to the TFTs 74 through the interlayer insulating film 75. The metal interconnect 76 extends to the surface of the interlayer insulating film 75, and constitutes a first electrodes 77 of organic EL display elements 71. On the interlayer insulating film 75, an insulating film (or a bank) 79 defining pixels (regions) 80.

As illustrated in FIG. 12, the organic EL display device 60 includes a display region 62 constituted by, for example, a plurality of pixels, and a peripheral circuit region 63 located at the periphery of the display region 62. In the peripheral circuit region 63, a drive circuit region 64 provided with drivers and a terminal region 65 provided with a plurality of terminals extending from the display region 62 are defined.

In the terminal region 65, in the same manner as the source terminals 15 provided in the source terminal region Ts already described with reference to FIGS. 2, 3, and 5, a plurality of terminals extending from the display region 62 are arranged at small pitches (5-30 μm) on the base layer 72 of an insulating substrate. Further, terminal covers of an oxide semiconductor are provided to cover part of each of the terminals, and are removed in regions each between adjacent ones of the terminals. In this manner, the present disclosure is also applicable to the organic EL display device 60.

The organic EL display device 60 is of a bottom emission type, in which light is emitted from the side on which the first electrode 77 is provided. Thus, in order to increase the efficiency of extraction of light, the first electrode 77 is preferably made of a thin film of a material having a high work function and a high light transmittance, such as ITO or $SnO_2$.

An organic EL layer 78 is formed on the first electrode 77. The organic EL layer 78 includes a hole transport layer and a light emitting layer. The hole transport layer is not limited as long as the hole transport layer has a high hole-injection efficiency. The hole transport layer may be made of, for example, an organic material such as a triphenylamine derivative, a poly(p-phenylene vinylene) (PPV) derivative, and a polyfluorene derivative.

The light emitting layer may be made of, but not limited to, 8-hydroxyxyquinoline derivative, a thiazole derivative, or a benzoxazole derivative, for example. Two or more of these materials may be combined together, or these materials may be combined with an additive, such as a dopant material.

The organic EL layer 78 has been illustrated to have a two-layer structure including a hole transport layer and a light emitting layer, but the organic EL layer 78 is not limited to this configuration. Alternatively, the organic EL layer 78 may have a single-layer structure including only a light emitting layer. Alternatively, the organic EL layer 78 may include a light emitting layer and one or more of a hole transport layer, a hole injection layer, an electron injection layer, and an electron transport layer.

A second electrode 81 is formed on the organic EL layer 78 and the insulating film 79. The second electrode 81 has a function of injecting electrons into the organic EL layer 78. The second electrode 81 may be made of a thin film of, for example, Mg, Li, Ca, Ag, Al, In, Ce, or Cu, but the material of the second electrode 81 is not limited to these materials.

The first electrode 77, the organic EL layer 78 formed on the first electrode 77 and including the light emitting layer, and the second electrode 81 formed on the organic EL layer 78 constitute the organic EL display element 71 formed on the display device substrate 83.

In the organic EL display device 60, the first electrode 77 has a function of injecting holes into the organic EL layer 78, and the second electrode 81 has a function of injecting electrons into the organic EL layer 78. Holes injected from the first electrode 77 and electrons injected from the second electrode 81 recombine in the organic EL layer 78, so that light is emitted from the organic EL layer 78. Since the base layer 72 as a substrate and the first electrode 77 can transmit light and the second electrode 81 can reflect light, emitted light is transmitted through the first electrode 77 and the base layer 72 to be extracted from the organic EL layer 78 (bottom emission type).

A planarized film 82 made of, for example, an acrylic resin or a polyparaxylene resin is formed on the second electrode 81. The planarized film 82 may have a thickness of, for example, 3-8 μm.

In the same manner as in the TFTs 5a described in the above embodiments, the TFTs 74 are TFTs using an oxide semiconductor layer. In the TFTs 74, the oxide semiconductor is used as a channel. In this manner, the organic EL display device 60 has a structure in which the TFTs 74 as switching devices for the pixels 80 and the organic EL display element 71 are formed on the base layer 72 as a film-like substrate.

INDUSTRIAL APPLICABILITY

The present disclosure is applicable to, for example, a substrate using a semiconductor layer of an oxide semiconductor, a method for fabricating the substrate, and a display device.

DESCRIPTION OF REFERENCE CHARACTERS 5a thin-film transistor
9 IC chip (electric component)
10a insulating substrate
11aa gate electrode
12 gate insulating film
13a oxide semiconductor layer
15 source terminal (terminal)
16aa source electrode
16b drain electrode
17 interlayer insulating film
18 planarized film
19a pixel electrode
19c protective cover
20a TFT substrate (substrate)
23 second terminal cover (another terminal cover)
24 first terminal cover (terminal cover)
28 channel protective layer
29 terminal cover protective layer 30 counter substrate (another substrate)
36 conductive film
40 liquid crystal layer (display medium layer)
50 liquid crystal display device
60 organic EL display device
71 organic EL display element (display element)
72 base layer (insulating substrate)
83 display device substrate (substrate)
D display region
P pitch
R region between source terminals (region between terminals)
T terminal region

The invention claimed is:
1. A substrate, comprising:
a plurality of terminals located on an insulating substrate and made of a metal;
a terminal cover covering part of each of the terminals and made of an oxide semiconductor;
an insulating film located between the terminal cover and the terminals and having a contact hole in which each of the terminals is partially exposed; and
another terminal cover made of a conductor and located on surfaces of the terminal cover and the contact hole, wherein
the terminal cover and the another terminal cover are removed in a region between each adjacent ones of the terminals,
an end surface of the terminal cover facing the region between the terminals is flush with an end surface of the another terminal cover facing the region between the terminals, and
a pitch between each adjacent ones of the terminals is from 5 µm to 30 µm.
2. The substrate of claim 1, wherein
the oxide semiconductor is a metal oxide containing at least a material selected from the group consisting of indium (In), gallium (Ga), aluminium (Al), copper (Cu), nickel (Ni), hafnium (Hf), and zinc (Zn).
3. The substrate of claim 2, wherein
the oxide semiconductor is indium gallium zinc oxide.
4. The substrate of claim 1, further comprising
a thin-film transistor including an oxide semiconductor layer.
5. The substrate of claim 4, wherein
the oxide semiconductor is indium gallium zinc oxide.
6. A display device, comprising:
the substrate of claim 1;
another substrate opposing the substrate; and
a display medium layer sandwiched between the substrate and the another substrate.
7. The display device of claim 6, wherein
the display medium layer is a liquid crystal layer.
8. A display device, comprising:
the substrate of claim 1; and
a display element located on the substrate.
9. The display device of claim 8, wherein
the display element is an organic EL display element.

* * * * *